United States Patent
Kurashige

(10) Patent No.: US 7,870,446 B2
(45) Date of Patent: Jan. 11, 2011

(54) INFORMATION PROCESSING APPARATUS AND NONVOLATILE SEMICONDUCTOR MEMORY DRIVE

(75) Inventor: Takehiko Kurashige, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/390,282

(22) Filed: Feb. 20, 2009

(65) Prior Publication Data
US 2009/0222703 A1    Sep. 3, 2009

Related U.S. Application Data

(63) Continuation of application No. PCT/JP2008/070721, filed on Nov. 7, 2008.

(30) Foreign Application Priority Data
Feb. 29, 2008    (JP)    ................ 2008-050808

(51) Int. Cl.
G11C 29/44    (2006.01)
G11C 29/50    (2006.01)

(52) U.S. Cl. ..................... 714/723; 714/718

(58) Field of Classification Search ............ None
See application file for complete search history.

(56) References Cited

U.S. PATENT DOCUMENTS

| | | | |
|---|---|---|---|
| 5,532,840 A | | 7/1996 | Asano et al. |
| 5,541,903 A | * | 7/1996 | Funahashi et al. ........ 369/53.16 |
| 5,555,388 A | * | 9/1996 | Shaughnessy ............... 711/100 |
| 6,185,134 B1 | | 2/2001 | Tanaka |
| 6,829,178 B2 | | 12/2004 | Koyama et al. |
| 2007/0088940 A1 | * | 4/2007 | Conley ........................ 713/1 |
| 2007/0150693 A1 | * | 6/2007 | Kaneko et al. .............. 711/202 |

FOREIGN PATENT DOCUMENTS

| | | |
|---|---|---|
| JP | 04-304647 | 10/1992 |
| JP | 06-202962 | 7/1994 |
| JP | 2003-323352 | 11/2003 |
| JP | 2008-009944 | 1/2008 |

OTHER PUBLICATIONS

PCT Search Report in a corresponding Japanse application No. PCT/JP2008/070721 dated Dec. 22, 2008.

* cited by examiner

Primary Examiner—Jeffrey A Gaffin
Assistant Examiner—Dipakkumar Gandhi
(74) Attorney, Agent, or Firm—Blakely, Sokoloff, Taylor & Zafman LLP

(57) ABSTRACT

According to one embodiment, an information processing apparatus includes an information processing apparatus main body, and a nonvolatile semiconductor memory drive. The semiconductor memory drive includes a control module configured to control execution of data read and write on a nonvolatile semiconductor memory in units of a predetermined number of sectors. In a case where a data size of write data from the information processing apparatus main body is less than a data size of the predetermined number of sectors, the control module reads, from the nonvolatile semiconductor memory, data in a predetermined number of sectors including a sector in which the write data is to be written, and in a case where an error is detected in the read data, the control module stores, in a management table, defective sector information which is indicative of a sector storing the data in which the error is detected.

14 Claims, 6 Drawing Sheets

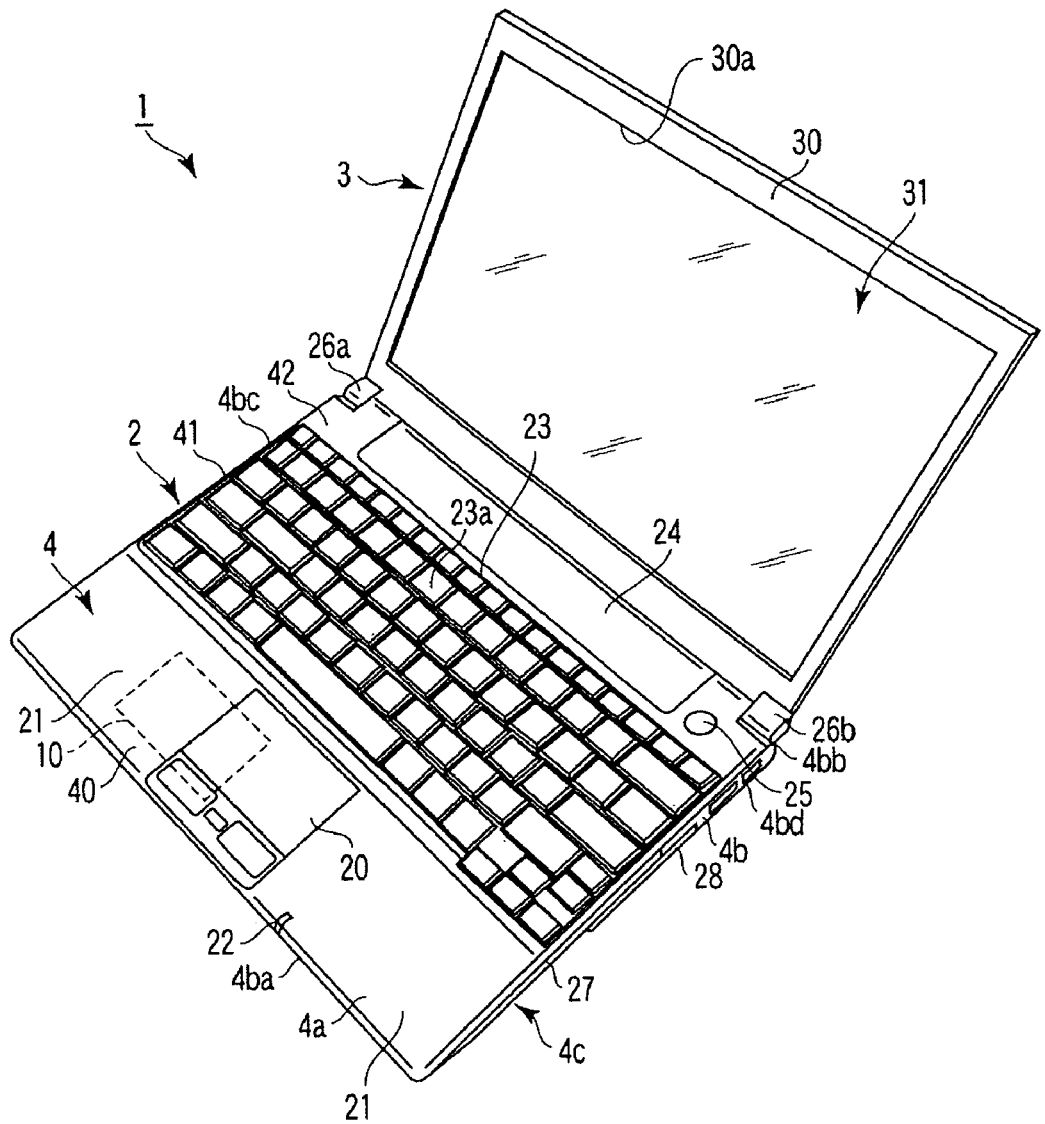
F I G. 1

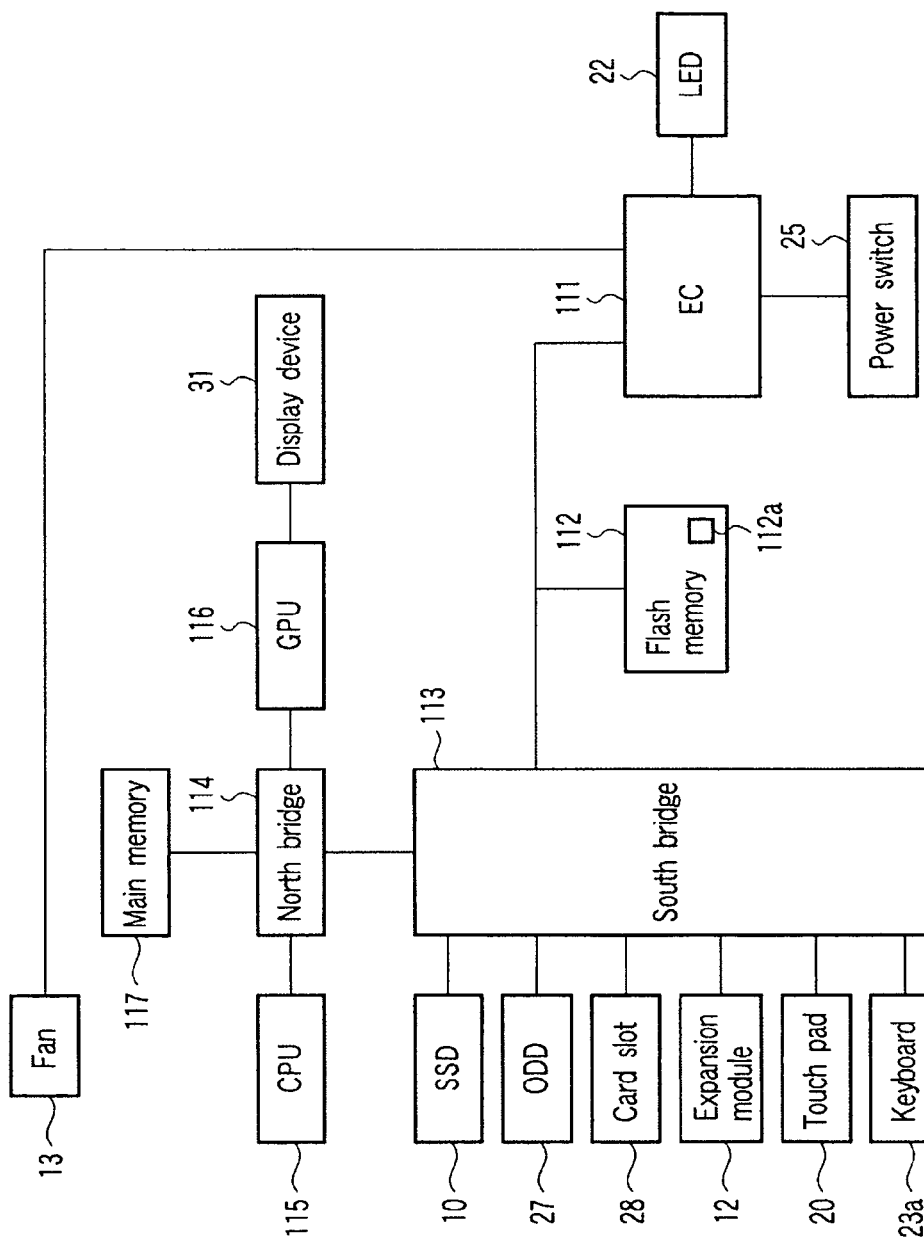
F I G. 2

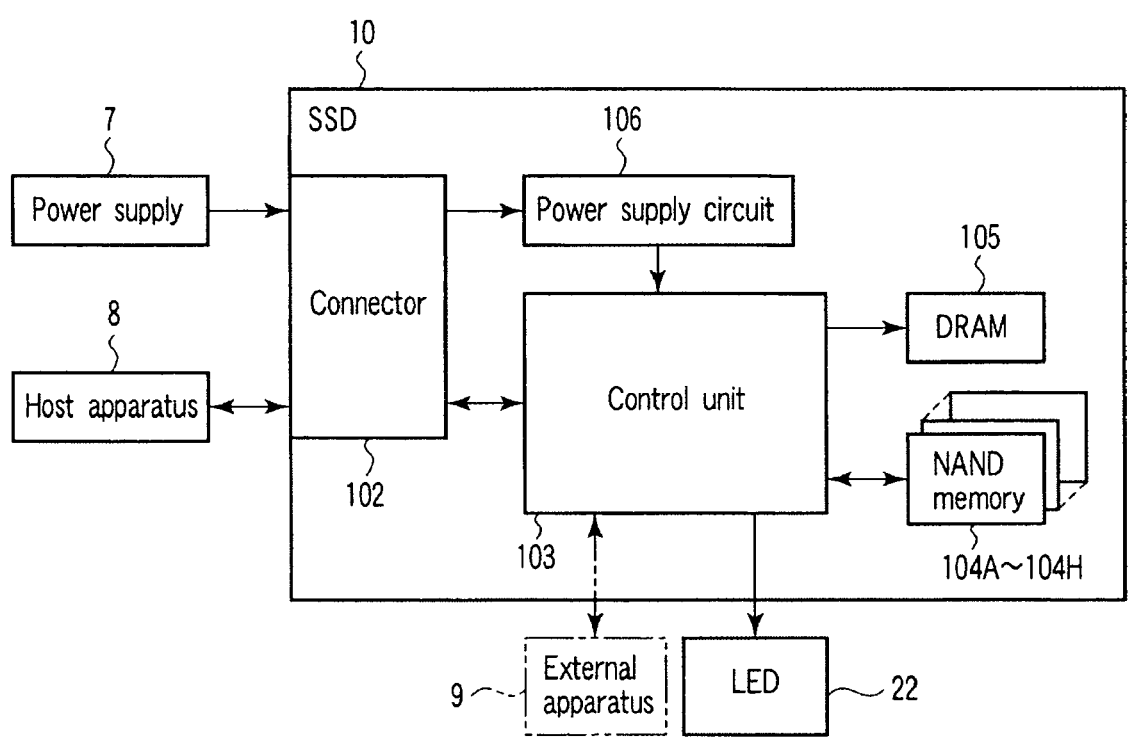
F I G. 3

INFORMATION PROCESSING APPARATUS AND NONVOLATILE SEMICONDUCTOR MEMORY DRIVE

CROSS REFERENCE TO RELATED APPLICATIONS

This is a Continuation Application of PCT Application No. PCT/JP2008/070721, filed Nov. 7, 2008, which was published under PCT Article 21(2) in English.

This application is based upon and claims the benefit of priority from Japanese Patent Application No. 2008-050808, filed Feb. 29, 2008, the entire contents of which are incorporated herein by reference.

BACKGROUND

1. Field

One embodiment of the present invention relates to an information processing apparatus and a nonvolatile semiconductor memory drive.

2. Description of the Related Art

Conventionally, there has been a semiconductor memory having a plurality of clusters each comprising a plurality of bits. As a system which manages this semiconductor memory, there is known a management system which is described, for example, in Jpn. Pat. Appln. KOKAI Publication No. 6-202962. This management system includes determination means for determining whether all bits in each cluster are normal or not, and management means for generating discrimination information which discriminates a cluster having normal bits and a cluster having defective bits, on the basis of a determination result by the determination means.

In this management system, normal bits and defective bits are discriminated and managed. It is thus possible to allocate a cluster having all normal bits to data which requires exact storage and reproduction, and to preferentially allocate a cluster including a defective bit to data which does not require exact storage and reproduction. Accordingly, since an inexpensive semiconductor memory, the quality of which is not guaranteed, can be used, the product cost can be suppressed.

In this management system, however, the creation of discrimination information is performed at the time of factory shipment of the semiconductor memory. Consequently, it is possible that even if a defect occurs in a cluster having all normal bits after shipment, the defect cannot be determined, and exact storage and reproduction of data may not be executed. It is thus required to realize a novel function for executing exact data write and exact data read-out.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 1 is a perspective view showing an example of the external appearance of an information processing apparatus according to an embodiment of the present invention;

FIG. 2 is a block diagram which schematically shows an example of the structure of the information processing apparatus according to the embodiment;

FIG. 3 is a block diagram which schematically shows an example of the structure of an SSD that is applied to the information processing apparatus according to the embodiment;

DETAILED DESCRIPTION

Figure 4:
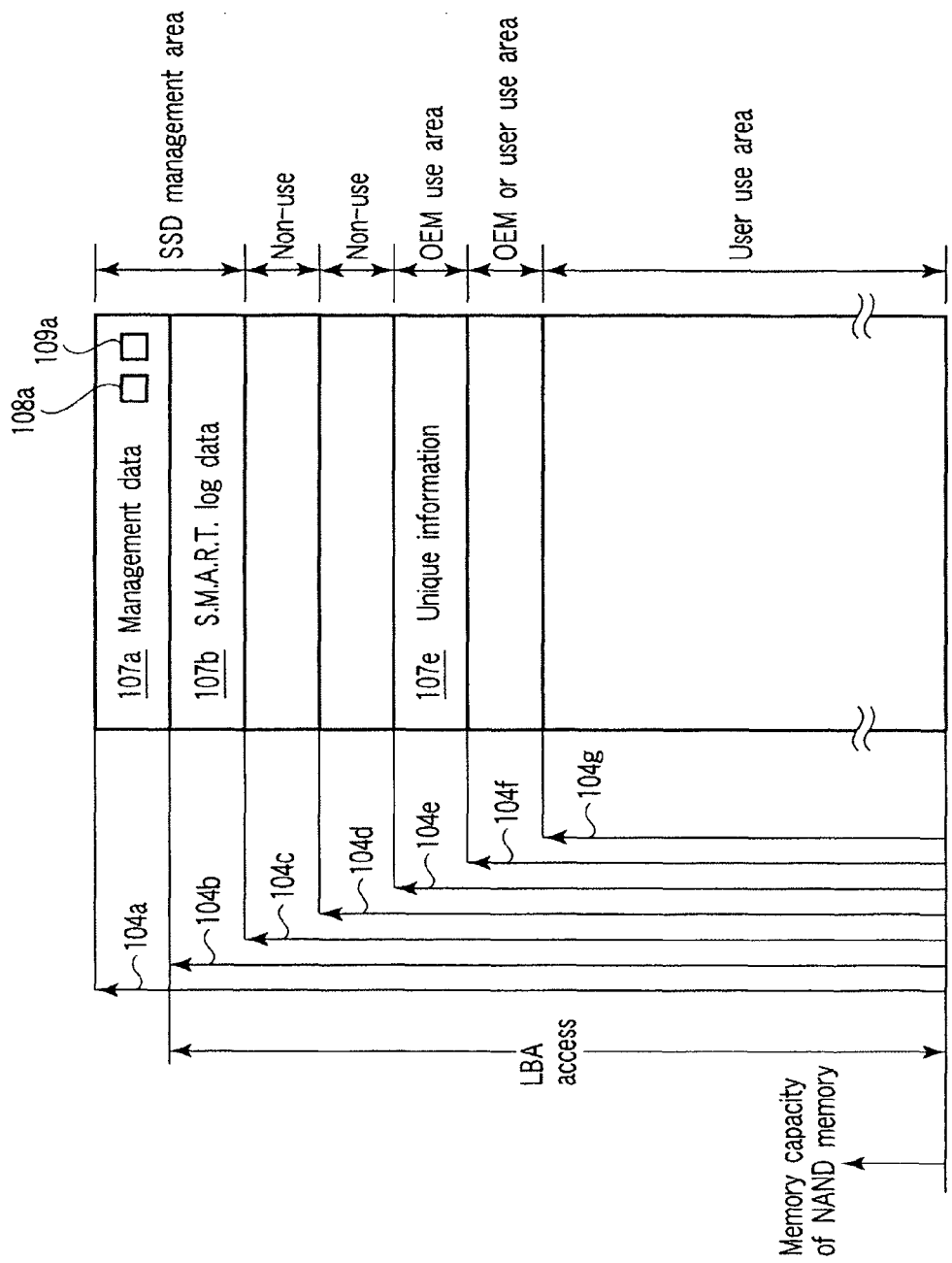
FIG. 4 schematically shows an example of the memory capacities and memory areas of the SSD shown in FIG. 3.

Various embodiments according to the invention will be described hereinafter with reference to the accompanying drawings. In general, according to one embodiment of the invention, there is provided an information processing apparatus comprising: an information processing apparatus main body; and a nonvolatile semiconductor memory drive which is accommodated in the information processing apparatus main body, the nonvolatile semiconductor memory drive including a nonvolatile semiconductor memory having a plurality of sectors, and a control module configured to control execution of data read and write on the nonvolatile semiconductor memory in units of a predetermined number of sectors, wherein in a case where a data size of write data from the information processing apparatus main body is less than a data size of the predetermined number of sectors, the control module reads, from the nonvolatile semiconductor memory, data in a predetermined number of sectors including a sector in which the write data is to be written, and in a case where an error is detected in the read data, the control module stores, in a management table, defective sector information which is indicative of a sector storing the data in which the error is detected.

This information processing apparatus can execute exact data write and exact data read-out.

<Structure of the Information Processing Apparatus>

FIG. 1 is a perspective view showing the external appearance of an information processing apparatus according to an embodiment of the present invention.

This information processing apparatus 1, as shown in FIG. 1, is composed of an information processing apparatus main body 2 and a display unit 3 which is attached to the main body 2.

The main body 2 has a box-shaped casing 4. The casing 4 includes an upper wall 4a, a peripheral wall 4b and a lower wall 4c. The upper wall 4a of the casing 4 includes a front part 40, a central part 41 and a back part 42 in the named order from the side close to a user who operates the information processing apparatus 1. The lower wall 4c is opposed to an installation surface on which the information processing apparatus 1 is disposed. The peripheral wall 4b includes a front wall 4ba, a rear wall 4bb and left and right side walls 4bc and 4bd.

The front part 40 includes a touch pad 20 which is a pointing device, a palm rest 21, and a light-emitting diode (LED) 22 which is turned on in association with the operation of respective parts of the information processing apparatus 1.

The central part 41 includes a keyboard mounting part 23 to which a keyboard 23a, which can input character information, etc., is attached.

The back part 42 includes a battery pack 24 which is detachably attached. A power switch 25 for powering on the information processing apparatus 1 is provided on the right side of the battery pack 24. A pair of hinge portions 26a and 26b, which rotatably support the display unit 3, are provided on the left and right sides of the battery pack 24.

An exhaust port (not shown) for exhausting the wind to the outside from the inside of the casing 4, is provided on the left side wall 4*bc* of the casing 4. In addition, an ODD (Optical Disc Drive) 27, which can read and write data on an optical storage medium such as a DVD, and a card slot 28, in/from which various cards can be inserted/taken out, are disposed on the right side wall 4*bd*.

The casing 4 is formed of a casing cover including a part of the peripheral wall 4*b* and the upper wall 4*a*, and a casing base including a part of the peripheral wall 4*b* and the lower wall 4*c*. The casing cover is detachably coupled to the casing base, and an accommodation space is formed between the casing cover and the casing base. This accommodation space accommodates, for instance, an SSD (Solid State Drive) 10 functioning as a nonvolatile semiconductor memory drive. The details of the SSD 10 will be described later.

The display unit 3 includes a display housing 30 having an opening portion 30*a*, and a display device 31 which is composed of, e.g. an LCD which can display an image on a display screen 31*a*. The display device 31 is accommodated in the display housing 30, and the display screen 31*a* is exposed to the outside of the display housing 30 through the opening portion 30*a*.

The casing 4 accommodates a main circuit board, an expansion module, a fan, etc., which are not shown, in addition to the above-described SSD 10, battery pack 24, ODD 27 and card slot 28.

FIG. 2 is a block diagram which schematically shows the system configuration of the information processing apparatus 1. The information processing apparatus 1, as shown in FIG. 2, includes an EC (Embedded Controller) 111, a flash memory 112 which stores a BIOS (Basic Input Output System) 112*a*, a south bridge 113, a north bridge 114, a CPU (Central Processing Unit) 115, a GPU (Graphic Processing Unit) 116 and a main memory 117, in addition to the above-described SSD 10, expansion module 12, fan 13, touch pad 20, LED 22, keyboard 23*a*, power switch 25, ODD 27, card slot 28 and display device 31.

The EC (Embedded Controller) 111 is a built-in system which controls the respective parts. The north bridge 114 is an LSI which controls connection between the CPU 115, GPU 116, main memory 117 and various buses. The CPU 15 is a processor which performs arithmetic processing of various signals, and executes an operating system and various application programs, which are loaded from the SSD 10 into the main memory 117. The CPU 116 is a display controller which executes display control by performing arithmetic processing of a video signal.

The expansion module 12 includes an expansion circuit board, a card socket which is provided on the expansion circuit board, and an expansion module board which is inserted in the card socket. The card socket supports, e.g. the Mini-PCI standard. Examples of the expansion module board include a 3G (3rd Generation) module, a TV tuner, a GPS module, and a Wimax (trademark) module.

The fan 13 is a cooling unit which cools the inside of the casing 4 on the basis of air feeding, and exhausts the air in the casing 4 to the outside as the wind via the exhaust port (not shown).

The EC 111, flash memory 112, south bridge 113, north bridge 114, CPU 115, GPU 116 and main memory 117 are electronic components which are mounted on the main circuit board.

<Structure of SSD>

FIG. 3 is a block diagram which schematically shows the structure of the SSD that is applied to the information processing apparatus 1 according to the embodiment. The SSD 10 is a nonvolatile semiconductor memory drive which, in place of a hard disk, is used as an external storage device of the information processing apparatus 1. The SSD 10, as shown in FIG. 3, substantially comprises a connector 102, a control unit 103, NAND memories (NAND flash EEPROMs) 104A to 104H, a DRAM (memory) 105, and a power supply circuit 106. The SSD 10 is the external storage device which stores data and programs, and the storage content of which is not lost even if no power is supplied. The SSD 10 is a drive which, unlike a hard disk drive, does not have a driving mechanism of a magnetic disk, a head, etc., but the SSD 10 can store programs, such as the OS (Operating System), and data which is created by the user or created on the basis of software, in memory areas of a NAND memory, which is a nonvolatile semiconductor memory, for a long time in a readable/writable manner, and can operate as a boot drive of the information processing apparatus 1.

The control unit 103 is connected to the connector 102, eight NAND memories 104A to 104H, DRAM 105 and power supply circuit 106. In addition, the control unit 103 is connected to the host apparatus 8 via the connector 102, and is connected, where necessary, to an external apparatus 9.

A power supply 7 is the batter pack 24 or an AC adapter (not shown). For example, a power of DC 3.3V is supplied to the power supply circuit 106 via the connector 102. In addition, the power supply 7 supplies power to the entirety of the information processing apparatus 1.

In the present embodiment, the host apparatus 8 is the information processing apparatus main body 2 (the main circuit board of the main body 2). The south bridge 113, which is mounted on the main circuit board, is connected to the control unit 103 via the connector 102. Data transmission/reception is executed between the south bridge 113 and control unit 103, for example, on the basis of the serial ATA standard.

The external apparatus 9 is an information processing apparatus which is different from the information processing apparatus 1. The external apparatus 9 is connected to the control unit 103 of the SSD 10 which is removed from the information processing apparatus 1, for example, on the basis of the RS-232C standard, and the external apparatus 9 has a function of reading out data which is stored in the NAND memories 104A to 104H.

The board, on which the SSD 10 is mounted, has the same outside size as an HDD (Hard Disk Drive) of, e.g. 1.8-inch type or 2.5-inch type. In the present embodiment, this board has the same outside size as the 1.8-inch type HDD.

The control unit 103 is a control module configured to control data read/write on the NAND memories 104A to 104H. Specifically, in accordance with a request (read command, write command, etc.) from the information processing apparatus main body 2 that functions as the host apparatus 8, the control unit 103 controls the execution of data read/write on the NAND memories 104A to 104H. Each NAND memory has a plurality of sectors. The control of execution of data read/write on the sectors of the NAND memories 104A to 104H, is executed in units of a predetermined number of sectors, which are called "cluster". The data transfer speed is, for example, 100 MB/Sec at a data read and 40 MB/Sec at a data write.

Each of the NAND memories 104A to 104H is a nonvolatile semiconductor memory having a memory capacity of, e.g. 16 GB. Each of the NAND memories 104A to 104H is composed of, e.g. an MLC (Multi-Level Cell)-NAND memory (multilevel NAND memory) in which 2 bits can be recorded in one memory cell. The MLC-NAND memory has such features that the allowable number of rewrites is smaller than an SLC (Single-Level Cell)-NAND memory, but the memory capacity can be increased more easily than the SLC (Single-Level Cell)-NAND memory.

The DRAM 105 is a buffer which temporarily stores data when data read/write is executed on the NAND memories 104A to 104H, by the control of the control unit 103. The DRAM 105 functions as a write cache which temporarily stores write data from the information processing apparatus main body 2 that functions as the host apparatus 8.

The connector 102 has a shape based on, e.g. the serial ATA standard. The control unit 103 and power supply circuit 106 may be connected to the host apparatus 8 and power supply 7 via different connectors.

The power supply circuit 106 converts DC 3.3V, which is supplied from the power supply 7, to, e.g. DC 1.8V and 1.2V, and supplies these three kinds of voltages to the respective parts in accordance with the driving voltages of the respective parts of the SSD 10.

<Memory Capacity of SSD>

FIG. 4 schematically shows an example of the memory capacities and memory areas of the SSD 10. The control unit 103 of the SSD 10 manages seven kinds of memory capacities 104a to 104g, which are shown in FIG. 4.

The memory capacity 104a is NAND Capacity, and is a maximum memory capacity using the memory areas of all NAND memories 104A to 104H. Specifically, the memory capacity 104a is the sum of the physical memory capacities of the NAND memories 104A to 104H. For example, if the memory capacity of each of the NAND memories 104A to 104H is 16 GB, the memory capacity 104a is 128 GB. The memory capacity 104a, i.e. the NAND Capacity, is given by, e.g. NAND structure information of a manufacture information write command of a UART (Universal Asynchronous Receiver Transmitter).

The memory capacity 104b is Max Logical Capacity, and is a maximum memory capacity that is accessible by a logical block address (LBA).

The memory capacity 104c is a S.M.A.R.T. log area start LBA, and is provided in order to divide the memory capacity 104b and the memory capacity 104d which will be described below. The S.M.A.R.T. log area start LBA indicates a first LBA of the memory area which stores log data.

The memory capacity 104d is Vender Native Capacity, and is a maximum memory capacity which is given as a user use area. The memory capacity 104d is given by, e.g. initial Identify Device data of an ATA specific command. In addition, the memory capacity 104d is determined by the manufacturer (Vender) at the time of design of the SSD 10 on the basis of the IDEMA (The International Disk Drive Equipment and Materials Association) standard, and is expressed by the following equation:

LBA=97,696,368+(1,953,504×((Capacity in GB)−50)).

The memory capacity 104e is OEM Native Capacity, and is a memory capacity which is determined at the time of manufacture by a request of an OEM (Original Equipment Manufacturer). The memory capacity 104e is given by, e.g. unique information write of an ATA specific command. In addition, the memory capacity 104e is a value which is returned by a Device Configuration Identify command when Device Configuration Overlay Feature Set is supported.

The memory capacity 104f is Native Capacity, and its initial value is equal to the memory capacity 104e. This value can be varied by a Device Configuration Set command when Feature Set is supported. In addition, the memory capacity 104f is a value which is returned by a Read Native Max Address (EXT) command.

The memory capacity 104g is Current Capacity and is a memory capacity during use by the user, and the initial value is equal to the memory capacity 104f. This value can be varied by a SET Max Address command. This value is returned by Word 61:60, and Word 103:100 of an Identify Device command.

The memory areas of the SSD 10 are present between the memory capacities 104a to 104g.

The memory area (management area) between the memory capacities 104a and 104b stores management data 107a for operating the SSD 10, an address conversion table (logical/physical table) 108a, and a bad cluster table (BCT) 109a which will be described later. The address conversion table (logical/physical table) 108a is a table for managing the correspondency between the logical block addresses LBA and the physical addresses of the NAND memories 104A to 104H, in units of a cluster. Each cluster is composed of a predetermined number of sectors, as described above. Each of the NAND memories 104A to 104H has a plurality of sectors. The sector is a memory unit of the NAND memories 104A to 104H. For example, in the case where one cluster is composed of eight sectors, the address conversion table (logical/physical table) 108a can store, with respect to each cluster (each 4 KB boundary of the memory areas of the NAND memories 104A to 104H), the logical block address LBA of, e.g. the first sector of the cluster and the physical address indicative of a certain memory area in the NAND memory, 104A to 104H, to which the first sector is allocated.

In the present embodiment, a cluster with a data size of 1 MB is also usable. The read/write for the memory area in the NAND memory, 104A to 104H, to which the cluster of 1 MB is allocated, is controlled in units of 1 MB. The read/write for the memory area in the NAND memory, 104A to 104H, to which the cluster of 4 KB is allocated, is controlled in units of 4 KB.

As described above, data read/write is executed in units of a cluster (in units of a predetermined number of sectors).

Each of the management data 107a, logical/physical table 108a and BCT 109a is data which is recorded in fixed areas in the NAND memories 104A to 104H. The LBA is not allocated to each of the management data 107a, logical/physical table 108a and BCT 109a. Thus, each of the management data 107a, logical/physical table 108a and BCT 109a cannot be accessed, with the LBA being used as a key. The control unit 103 has a fixed access path for accessing each of the management data 107a, logical/physical table 108a and BCT 109a, and executes access to each of the management data 107a, logical/physical table 108a and BCT 109a via the fixed access path.

The memory area between the memory capacity 104b and memory capacity 104c stores S.M.A.R.T. (Self-Monitoring Analysis and Reporting Technology) log data 107b. The S.M.A.R.T. log data 107b is, for instance, statistical information such as temperature information. The LBAs, which are allocated to the S.M.A.R.T. log data 107b, are locally used in order for firmware, which is executed in the control unit 103, to access the S.M.A.R.T. log data 107b. The firmware, which is executed in the control unit 103, can access the S.M.A.R.T. log data 107b by using the LBA as a key. However, the host apparatus 8 cannot access the S.M.A.R.T. log data 107b by an ordinary read or write command.

A non-use memory area having a memory capacity of 2 MB is set in the memory area between the memory capacities 104c and 104d. The reason for this is that the minimum memory unit of the LBA is 8 sectors, which is a memory unit corresponding to 4 KB (a large memory unit is 1 MB), whereas the actual minimum recording unit of data is 1 sector as a matter of course, and thus the S.M.A.R.T. log data 107*b* and the data recorded in the memory area equal to or lower than the memory capacity 104*d* are independently handled by providing an empty memory area with a memory capacity of 1 MB or more between the memory capacities 104*c* and 104*d*.

The memory area between the memory capacity 104*d* and 104*e* is a non-use area, and the memory capacity 104*d* and 104*e* have the same value except for a particular case.

The memory area between the memory capacities 104*e* and 104*f* is a memory area which is used by the OEM. As described above, the unique information 107*e*, which is determined by the request of the OEM, is written in this memory area.

The memory area between the memory capacities 104*f* and 104*g* is a memory area which is used by the OEM or the user. Data write is executed in this memory area by the setting of the OEM or user.

The memory area of the memory capacity 104*g* is a memory area which is used by the user, and data write is executed in this memory area by the setting of the user.

The memory capacities 104*a* to 104*g* satisfy a relationship which is expressed by the following formula:

memory capacity 104*a*>memory capacity 104*b*>memory capacity 104*c*>memory capacity 104*d*≧memory capacity 104*e*≧memory capacity 104*f*≧memory capacity 104*g*.

At the time of shipment from the manufacturer (Vender), the memory capacities 104*d* to 104*g* have the same value.

<Structure of NAND Memory>

Figure 5:
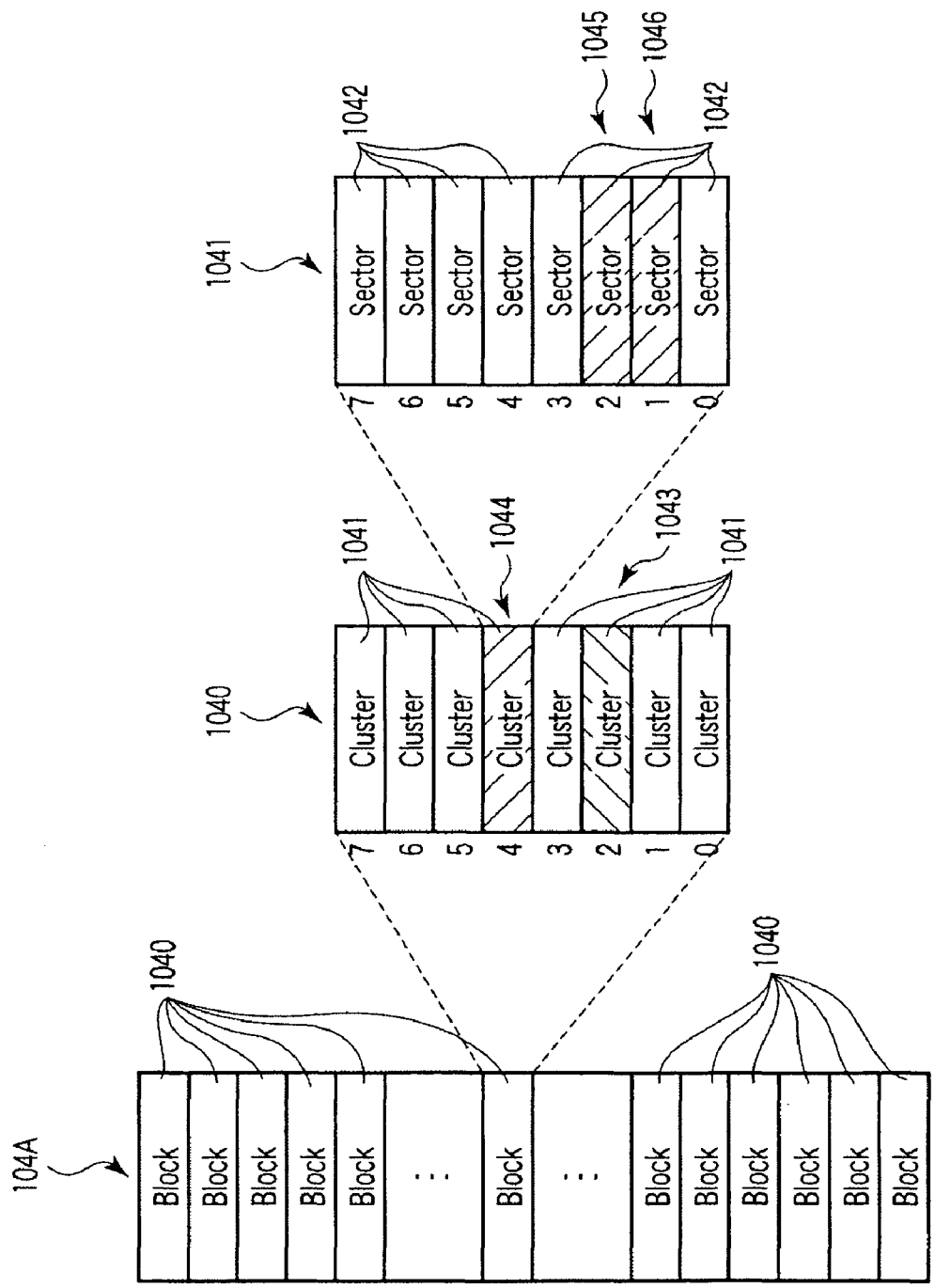
FIG. 5 schematically shows an example of the structure of a NAND memory which is provided in the SSD shown in FIG. 3.

FIG. 5 schematically shows the structure of the NAND memory which is used in the present embodiment. Since the NAND memories 104A to 104H have the same function and structure, a description is given of the NAND memory 104A. The numbers, which are added to the left sides of clusters 1041 and sectors 1042, indicate cluster numbers and sector numbers.

The NAND memory 104A is composed of a plurality of blocks (a plurality of erase blocks) 1040. Each block 1040 is composed of a plurality of clusters, e.g. 1024 clusters 1041. Each cluster 1041 is composed of a predetermined number of sectors, e.g. eight sectors 1042. In the case where each cluster is composed of eight sectors, the data size of each cluster is 4 KB. In the present embodiment, as described above, a cluster having a data size of 1 MB is also usable. The data read/write is executed in units of a cluster (in units of a predetermined number of sectors).

The control unit 103 of the SSD 10 executes a write process for writing write data from the host apparatus 8 in the NAND memory 104A, in response to a write command from the host apparatus 8. The data write is executed in units of a cluster.

Accordingly, when the write data, which is less than the data size of one cluster 1041, is written, the control unit 103 executes read from a predetermined number (e.g. 8) of sectors 1042, which constitute the cluster 1041, on the basis of the management data 107*a*, and temporarily stores the data of these sectors in the DRAM 105. The control unit 103 executes, on the DRAM 105, write of the write data on the cluster from which data read has been executed, and writes the cluster, in which the write data has been written, into the corresponding cluster 1041 of the NAND memory from the DRAM 105.

Specifically, using the logical/physical table 108*a*, the control unit 103 of the SSD 10 manages the allocation of the LBA to each sector in the NAND memory 104A on a cluster-by-cluster basis, and controls data read/write on the NAND memory 104A on a cluster-by-cluster basis. In the case where the data size of the write data from the host apparatus 8 (information processing apparatus main body 2) is less than the data size of the cluster (e.g. 4 KB or 1 KB), the control unit 103 reads, from the NAND memory 104A, the data stored in the cluster (e.g. 8 sectors) including the sectors in which the write data is to be written. The control unit 103 merges the read data and write data, thereby generating new write data having the data size of one cluster (e.g. 8 sectors), and the control unit 103 writes the generated write data in the NAND memory 104A.

<Structure of BCT>

Figure 6:
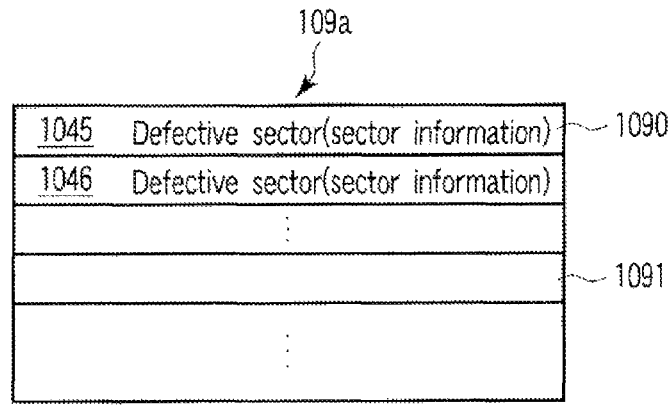
FIG. 6 schematically shows an example of the structure of a BCT which is used in the SSD shown in FIG. 3.

FIG. 6 is a view which schematically shows the structure of the bad cluster table (BCT) which is used in the present embodiment. The BCT (management table) 109*a* is a table which is composed of a plurality of entries 1090. One entry 1090 has 5 bytes, which are the sum of a cluster address (4 bytes) and a bit map (1 byte) in the cluster. Entries of about 4K are secured in the BCT (management table) 109*a* so as to enable the operation even if a defect occurs in one block (1K clusters).

In the BCT 109*a* shown in FIG. 6, two defective sectors (defective memory units) 1045 and 1046 are registered, by way of example. The BCT 109*a* is created by the control unit 103 at the time of refresh of the SSD 10, and is stored in the management data 107*a*. In the data read from the sectors, which is executed at the time of refresh (data write) of the SSD 10, when a read error has occurred, defective sector information, which is indicative of the sector (defective sector) in which the read error has occurred, is stored in the BCT 109*a* by the control unit 103.

As shown in FIG. 5 and FIG. 6, for example, the control unit 103 registers a cluster 1041 including a defective sector 1045, an error in which cannot be corrected by an error correction process, or a cluster 1041 including a defective sector 1045, in which an error has occurred at the time of refresh, in the BCT 109*a* as a defective cluster 1044.

In the BCT 109*a*, for example, an entry 1090, in which information of a defective cluster is not stored, is referred to as a free entry 1091.

For example, when data write is normally executed in the defective cluster 1044, the control unit 103 deletes the corresponding entry 1090 of the BCT 109*a*. The reason for this is that even if the defective cluster 1044 is defective in data read, if data write is normally completed, data read can normally be executed thereafter. Thus, since the defective cluster 1044 is re-used, the real functions of the information processing apparatus 1 and SSD 10 can be used for a long time.

The storage of the defective sector information in the BCT 109*a* is executed when a data read error has occurred at the time of write. As described above, in the case where the data size of the write data from the host apparatus 8 (information processing apparatus main body 2) is less than the data size of the cluster, the control unit 103 reads from the NAND memory 104A the data in the cluster including sector in which write data is to be written. The sector, in which write data is to be written, is designated by the logical block address LBA which is included in the write command from the host apparatus 8.

Needless to say, it is not always necessary to read all data stored in the 8 sectors belonging to the cluster which includes the sectors in which the write data is to be written. It is possible to read from the NAND memory 104A only the data (missing data) which is stored in a sector other than the sectors in which the write data is to be written. The control unit 103, for example, merges the read data (missing data) and the write data, thereby generating new write data having a data size corresponding to one cluster (8 sectors). The control unit 103 writes in the NAND memory 104A the new write data having the data size corresponding to one cluster. In this case, the new write data is written, for example, in the free cluster which is prepared on the NAND memory 104A, and the data in the original cluster is invalidated.

When the missing data is read, the control unit 103 executes error detection of the read missing data. If the occurrence of an error (ECC error) is detected in the read missing data, the control unit 103 stores the defective sector information, which is indicative of the sector storing the data in which an error is detected, in the free entry of the BCT 109a.

When an error is detected in the read missing data, it is not possible to generate correct write data corresponding to one cluster. In the present embodiment, however, the defective sector information, which is indicative of the defective sector storing the data in which the ECC error has occurred, is stored in the BCT 109a, and the new write data corresponding to one cluster, which is obtained by merging the data in which the ECC error has occurred and the write data from the host apparatus 8, is written in the free cluster of the NAND memory 104A. Thus, when the control unit 103 receives, subsequently, a read command from the host apparatus 8 which designates the LBA of the missing data in which the ECC error has occurred, the control unit 103 can surely return a read error to the host apparatus 8, thus preventing erroneous content data from being sent to the host apparatus 8. Hence, at the time of the read of the missing data, which is executed at the time of the write process, even if an ECC error occurs in the read data, the write process can normally be completed without aborting the write process, and the write data from the host apparatus 8 can be written in the NAND memory 104A. Therefore, it is possible to execute exact write of the write data from the host apparatus 8, and exact read of data.

The storage of the defective sector information in the BCT 109a is executed not only at the time of write, but also at the time of a wear leveling process. Specifically, the control unit 103 executes the wear leveling process for leveling the number of writes in the respective blocks in the NAND memory 104A. In the wear leveling process, data move is executed. When the wear leveling process is executed, if an error (ECC error) is detected in the data that is read from the NAND memory 104A, the control unit 103 stores the defective sector information, which is indicative of the sector storing the data in which the error is detected, into a free entry in the BCT 109a.

The defective sector information of the BCT 109a, as described above, is used in order to inform the host apparatus 8 of a read error. Specifically, the control unit 103 refers to the BCT 109a in response to the reception of the read command from the host apparatus 8. The control unit 103 determines whether a to-be-read sector, which is designated by the LBA included in the read command, is a defective sector or not, that is, whether the defective sector information indicative of the to-be-read sector is stored in the BCT 109a or not. In the case where the defective sector information indicative of the to-be-read sector is stored in the BCT 109a, the control unit 103 informs the host 8 of the occurrence of the error, and does not execute the process of actually reading the to-be-read sector from the NAND memory 104A. It is possible, therefore, to prevent the erroneous content data from being sent to the host 8.

In addition, in the case where data write is successfully executed in the sector which is indicated by the defective sector information stored in the BCT 109a, the control unit 103 deletes the defective sector information from the BCT 109a. For example, in the state in which a certain LBAn is stored in the BCT 109a as defective sector information, when the control unit 103 has received from the host apparatus 8 a write command designating this LBAn, the control unit 103 executes the write process for the cluster including the sector to which this LBAn is allocated. If this write process is successfully executed, the data of the sector, to which the LBAn is allocated, is correctly updated. Thus, the LBAn is no longer a defective sector.

<Operation>

The operation of the information processing apparatus 1 will now be described with reference to the drawings.

(Operation Mode Switching of SSD on the Basis of Capacity of BCT)

Figure 7:
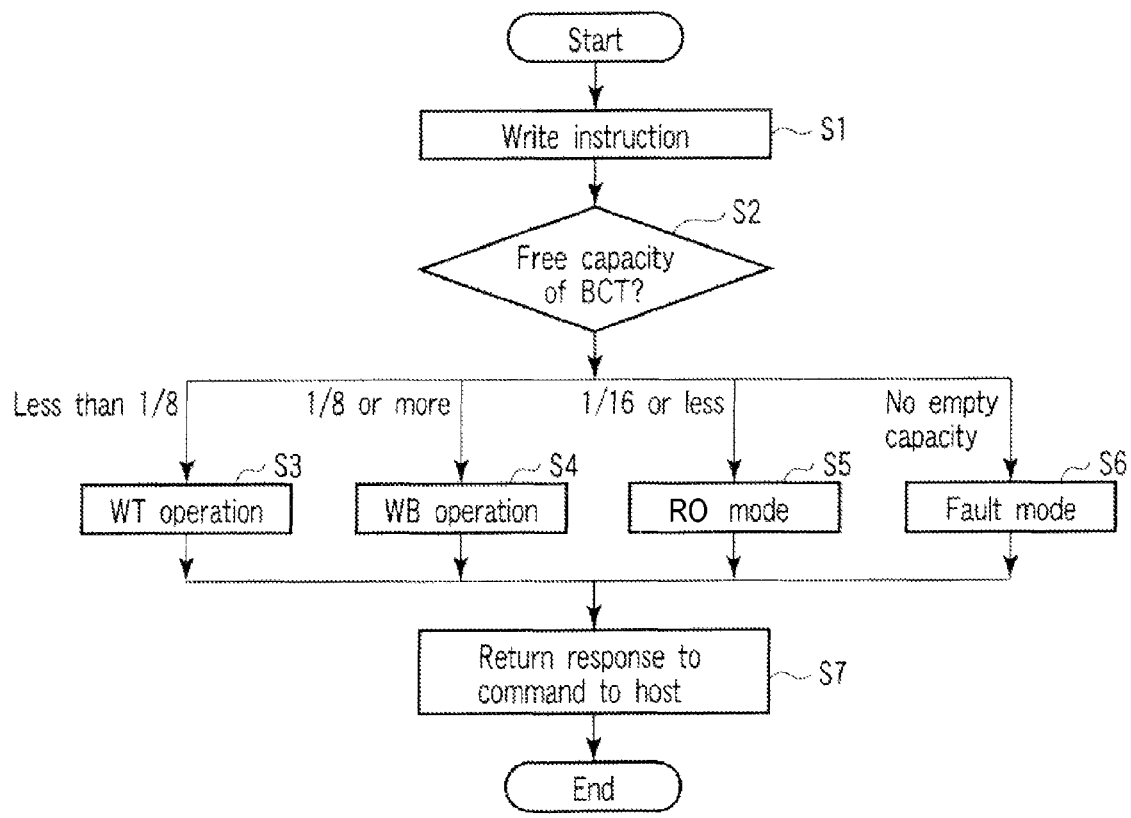
FIG. 7 is a flow chart which schematically illustrates an example of the operation of the SSD shown in FIG. 3.

FIG. 7 is a flow chart illustrating the procedure of an SSD operation mode switching process according to the present embodiment.

To start with, if the user presses the power switch 25, the EC 111 detects the pressing of the power switch 25 and starts supplying power from the power supply 7 to the respective parts of the information processing apparatus 1. In addition, the EC 111 boots up the information processing apparatus 1 on the basis of the BIOS 112a.

If the boot of the information processing apparatus 1 is completed, the user performs an operation on the information processing apparatus 1 by using the touch pad 20 and keyboard 23a, while viewing the display screen 31a of the display device 31.

Upon accepting the operation by the user, the information processing apparatus 1 performs a predetermined operation according to the operation by the user. For example, in the case where the CPU 15 of the information processing apparatus 1 has accepted the operation for displaying the data, which is stored in the SSD 10, on the display device 31, the CPU 115 sends to the SSD 10 a read command for instructing data read-out from the SSD 10. Responding to the read command, the control unit 103 of the SSD 10 executes data read from the NAND memories 104A to 104H, and sends the read data to the GPU 116 via the south bridge 113 and north bridge 114. The GPU 116 displays the data as an image on the display device 31.

For example, when the user processes an image by the operation of an application and instructs saving of the processed image, which is displayed on the display screen 31a, by using the touch pad 20 and keyboard 23a (S1), the CPU 115 sends to the SSD 10 a write command which instructs the SSD 10 to write the image data of the processed image.

If the control unit 103 of the SSD 10 receives the write command from the CPU 115 via the connector 102, the control unit 103 of the SSD 10 refers to the management data 107a of the NAND memories 104A to 104H, in order to store the image data in the NAND memories 104A to 104H, and determines the NAND memory in which the image data is to be stored.

For example, in order to write the image data (hereinafter referred to as "data") in the block 1040 shown in FIG. 5, on the basis of the management data 107a, the control unit 103 refers to the BCT 109a and confirms the capacity (free capacity) of the BCT 109a (S2).

If the free entry 1091 of the BCT 109a, that is, the free capacity of the BCT 109a, is less than ⅛ (first capacity) of the capacity of the BCT 109a, the control unit 103 operates in a write-through mode (WT mode) (S3), executes the command process corresponding to the write command in the WT mode, and informs the host apparatus 8 of the completion of write when the command process is completed (S7).

In the operation in the WT mode, the block 1040, in which data write is executed, is stored, together with the data, in the DRAM 105. In the DRAM 105, data write is executed in the block 1040, from which data read is executed, and data write is executed in the block 1040 of the corresponding NAND memory 104A from the DRAM 105. Then, a response, which indicates the end of normal data write, is returned to the host apparatus 8. In short, in the WT mode, the control unit 103 writes the write data in any one of the NAND memories 104A to 104H in response to the write command, and after the write data is actually written in the NAND memory, 104A to 104H, the control unit 103 informs the host apparatus 8 of the completion of write.

In the WT mode, in the case where the data size of the write data from the host apparatus 8 is less than the data size of one cluster, the control unit 103 reads, from any one of the NAND memories 104A to 104H, the data in the cluster including the sectors which are designated by the LBA included in the write command, in order to generate the write data corresponding to one cluster, and the control unit 103 stores the read data in the DRAM 105. At this read time, as described above, the process of detecting the ECC error of the read data and the process of storing the defective sector information in the BCT 109*a* are executed. A write data corresponding to one cluster is generated by merging the read data and the write data from the host apparatus 8. After the write data corresponding to one cluster is written in any one of the NAND memories 104A to 104H, the control unit 103 informs the host apparatus 8 of the completion of write.

If the capacity of the free entry 1091, that is, the free capacity of the BCT 109*a*, has transitioned from the state in which the capacity of the free entry 1091 is less than ⅛ of the capacity of the BCT 109*a* to the state in which the capacity of the free entry 1091 is ⅛ or more of the capacity of the BCT 109*a*, the control unit 103 switches the operation mode of the control unit 103 from the WT mode to a write-back mode (WB mode) (S4), executes the command process corresponding to the write command in the WB mode, and informs the host apparatus 8 of the completion of write when the command process is completed (S7).

The operation in the WB mode is an operation which is executed when the residual memory capacity of the SSD 10 is large. After the write data is stored in the DRAM 105. A response, which indicates the end of normal data write, is returned to the host apparatus 8. In short, in the WB mode, the control unit 103 informs the host apparatus 8 of the completion of write, at a time point when the write data from the host apparatus 8 is written in the DRAM 105 which serves as a write cache. The process (cache flash) of writing the write data of the write cache into the NAND memory, 104A to 104H, is executed in response to reception of a flash command from the host apparatus 8 or after a predetermined time has passed since the reception of the write command. In the case where the data size of the write data is less than the data size of one cluster, the control unit 103 reads at the cache flash time, from any one of the NAND memories 104A to 104H, the data in the cluster including the sectors which are designated by the LBA included in the write command, in order to generate the write data corresponding to one cluster. At this read time, as described above, the process of detecting the ECC error of the read data and the process of storing the defective sector information in the BCT 109*a* are executed. A write data corresponding to one cluster is generated by merging the read data and the write data. The write data corresponding to one cluster is written in any one of the NAND memories 104A to 104H.

This WB mode operation is an operation which is effective when the residual memory capacity of the SSD 10 is large. The reason for this is that in the case where the residual memory capacity of the SSD 10 is large, the data which is stored in the DRAM 105 can surely be stored in the NAND memories 104A to 140H.

When the free capacity of the BCT 109*a* is about ⅛, the control unit 103 determines that the residual memory capacity of the SSD 10 is small and first executes the WT operation in which data can surely be stored. Then, when the memory capacity has increased to some degree, the control unit 103 restores the operation to the normal WB operation. In this case, when the capacity of the BCT 109*a* has exceeded ⅛, the control unit 103 switches the operation to the WB operation. Alternatively, the WT operation may be continued, and when the free capacity of the BCT 109*a* has become sufficient, the operation may be restored to the WB operation. In addition, in the case where the power to the information processing apparatus 1 is turned off while the WT operation is being continued, and then the power is turned on again, the operation is switched from the WT operation to the WB operation.

As has been described above, in the present embodiment, when the free capacity of the BCT 109*a* decreases to ⅛, the operation mode of the control unit 103 transitions from the WB mode to the WT mode. In the WB mode, at a time point when the write data is written in the write cache, the completion of the write command is reported to the host apparatus 8, and the read of missing data is executed at the time of the cache flash. Thus, in the case where the number of free entries of the BCT 109 decreases, such a problem may possibly occur that the defective sector information cannot be stored in the BCT 109*a*. By contrast, in the WT mode, even in the case where a free entry for writing the defective sector information is no longer present in the BCT 109*a*, the occurrence of an error can be reported to the host apparatus 8 during the write process.

In addition, when the free entry 1091 of the BCT 109*a* has become ¹⁄₁₆ or less (second capacity) of the capacity of the BCT 109*a*, the control unit 103 transitions to an RO (Read Only) mode (S5), and returns a write protect error to the host apparatus 8 which has sent the write command (S7). The control unit 103 transitions to the RO mode, also in the case where the sector 1042, in which a read defect occurs, increases three times in succession.

The RO mode is a mode in which data write is not executable and only data read is executable. In other words, in the RO mode, the control unit 103 prohibits write access to the NAND memories 104A to 104H by the host apparatus 8, and permits only read access to the NAND memories 104A to 104H by the host apparatus 8.

Further, if there is no longer a free entry 1091 in the BCT 109*a*, the control unit 103 transitions to a fault mode (S6), and returns an abort error to the host apparatus 8 which has sent a read/write command (S7).

The fault mode is a mode in which neither data read nor data write can be executed from the host apparatus 8, and the fault mode is representative of a state in which repair is needed. In other words, in the case where there is no longer a free capacity in the BCT 109*a*, the control unit 103 operates in the fault mode which prohibits read access and write access to the NAND memories 104A to 104H by the host apparatus 8.

In the conventional nonvolatile semiconductor memory drive, since the free cluster 1043, in which data write is executed, is not the defective cluster 1044 in which a read defect occurs by data read, the data write is normally finished. However, in the conventional nonvolatile semiconductor memory drive, since data write in the block 1040 including the defective cluster 1044 is normally finished, it is possible that, for example, when the data stored in the block 1040 is reproduced, a problem occurs in the reproduction by the read of the defective cluster 1044.

However, in the SSD 10 which is mounted in the information processing apparatus 1 according to the present embodiment, the operation mode can be switched on the basis of the free capacity in the BCT 109*a*. Thus, the problem due to the defective cluster 1044 can be avoided, and the real function of the SSD 10 can be used for a long time.

According to the above-described embodiment, in the case where an ECC error is detected by the read of missing data, which is executed at the time of the write process, the defective sector information, which indicates the defective sector storing the missing data, is stored in the BCT 109*a*. Thus, when the read of missing data is executed at the time of the write process, even if an ECC error occurs in the read data, the write process can normally be completed without aborting the write process, and the write data from the host apparatus 8 can be written in the NAND memory 104A. In addition, in the case where the control unit 103 subsequently receives a read command from the host apparatus 8, which designates the LBA of the missing data in which the ECC error has occurred, the control unit 103 can surely return a read error to the host apparatus 8, and it is possible to prevent data of erroneous content from being sent to the host apparatus 8. Therefore, exact write of write data from the host apparatus 8 and exact read of data can be executed.

Furthermore, in the present embodiment, on the basis of the free capacity of the BCT 109, the operation mode can be switched between the WT mode, WB mode, RO mode and fault mode, and the defective cluster 1041 can be re-used. Therefore, the SSD 10 can efficiently be controlled, the exact data write and data read can be executed, and the real function of the SSD 10 can be used for a long time.

The various modules of the systems described herein can be implemented as software applications, hardware and/or software modules, or components on one or more computers, such as servers. While the various modules are illustrated separately, they may share some or all of the same underlying logic or code.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An information processing apparatus comprising:
an information processing apparatus main body; and
a nonvolatile semiconductor memory drive which is accommodated in the information processing apparatus main body, the nonvolatile semiconductor memory drive including a nonvolatile semiconductor memory having a plurality of sectors, and a control module configured to control execution of data read and write on the nonvolatile semiconductor memory in units of a predetermined number of sectors, wherein in a case where a data size of write data from the information processing apparatus main body is less than a data size of the predetermined number of sectors, the control module reads, from the nonvolatile semiconductor memory, data in a predetermined number of sectors including a sector in which the write data is to be written, and in a case where an error is detected in the read data, the control module stores, in a management table, defective sector information which is indicative of a sector storing the data in which the error is detected.

2. The information processing apparatus of claim 1, wherein the control module writes, in the nonvolatile semiconductor memory, new write data having a data size of the predetermined number of sectors, which is obtained by merging the read data and the write data.

3. The information processing apparatus of claim 1, wherein the nonvolatile semiconductor memory drive includes a write cache which temporarily stores the write data from the information processing apparatus main body, and
the control module operates, in a case where a free capacity of the management table is a first capacity or more, in a write-back mode in which completion of write is reported to the information processing apparatus main body at a time point when the write data from the information processing apparatus main body is written in the write cache, and the control module operates, in a case where the free capacity of the management table is less than the first capacity, in a write-through mode in which completion of write is reported to the information processing apparatus main body after the write data is written in the nonvolatile semiconductor memory.

4. The information processing apparatus of claim 3, wherein the control module operates, in a case where the free capacity of the management table is a second capacity or less, which is smaller than the first capacity, in a read-only mode in which write access to the nonvolatile semiconductor memory by the information processing apparatus main body is prohibited, and read access to the nonvolatile semiconductor memory by the information processing apparatus main body is permitted.

5. The information processing apparatus of claim 1, wherein the nonvolatile semiconductor memory is composed of a plurality of blocks, each of the blocks is composed of 1024 clusters, and each of the clusters includes eight sectors.

6. The information processing apparatus of claim 1, wherein the control module executes a wear leveling process for leveling allowable numbers of writes of the blocks of the nonvolatile semiconductor memory, and the control module stores, in a case where an error is detected in data that is read from the nonvolatile semiconductor memory when the wear leveling process is executed, defective sector information, which is indicative of a sector storing the data in which the error is detected, in the management table.

7. The information processing apparatus of claim 1, wherein in a case where write of data to a sector, which is indicated by the defective sector information stored in the management table, is successfully executed, the control module deletes the defective sector information from the management table.

8. The information processing apparatus of claim 1, wherein in a case where there is no longer a free capacity of the management table, the control module operates in a fault mode in which read access and write access to the nonvolatile semiconductor memory by the information processing apparatus main body are prohibited.

9. The information processing apparatus of claim 1, wherein the control module determines, in response to reception of a read command from the information processing apparatus main body, whether the defective sector information indicative of the sector designated by the read command is stored in the management table, and informs the information processing apparatus main body of occurrence of an error in a case where the defective sector information indicative of the sector designated by the read command is stored in the management table.

10. A nonvolatile semiconductor memory drive which is used as an external storage device of an information processing apparatus, comprising:
a nonvolatile semiconductor memory having a plurality of sectors; and
a control module configured to control execution of data read and write on the nonvolatile semiconductor memory in units of a predetermined number of sectors, wherein in a case where a data size of write data from the information processing apparatus is less than a data size of the predetermined number of sectors, the control module reads, from the nonvolatile semiconductor memory, data in a predetermined number of sectors including a sector in which the write data is to be written, and in a case where an error is detected in the read data, the control module stores, in a management table, defective sector information which is indicative of a sector storing the data in which the error is detected.

11. The nonvolatile semiconductor memory drive of claim 10, wherein the control module writes, in the nonvolatile semiconductor memory, new write data having a data size of the predetermined number of sectors, which is obtained by merging the read data and the write data.

12. The nonvolatile semiconductor memory drive of claim 10, wherein the nonvolatile semiconductor memory drive includes a write cache which temporarily stores the write data from the information processing apparatus, and the control module operates, in a case where a free capacity of the management table is a first capacity or more, in a write-back mode in which completion of write is reported to the information processing apparatus at a time point when the write data from the information processing apparatus is written in the write cache, and the control module operates, in a case where the free capacity of the management table is less than the first capacity, in a write-through mode in which completion of write is reported to the information processing apparatus after the write data is written in the nonvolatile semiconductor memory.

13. The nonvolatile semiconductor memory drive of claim 10, wherein the control module operates, in a case where the free capacity of the management table is a second capacity or less, which is smaller than the first capacity, in a read-only mode in which write access to the nonvolatile semiconductor memory by the information processing apparatus is prohibited, and read access to the nonvolatile semiconductor memory by the information processing apparatus is permitted.

14. The nonvolatile semiconductor memory drive of claim 10, wherein the control module executes a wear leveling process for leveling allowable numbers of writes of the blocks of the nonvolatile semiconductor memory, and the control module stores, in a case where an error is detected in data that is read from the nonvolatile semiconductor memory when the wear leveling process is executed, defective sector information, which discriminates a sector storing the data in which the error is detected, in the management table.

* * * * *